United States Patent [19]

Mizuno

[11] Patent Number: 5,789,942
[45] Date of Patent: Aug. 4, 1998

[54] HIGH SPEED SIGNAL LEVEL CONVERTING CIRCUIT HAVING A REDUCED CONSUMED ELECTRIC POWER

[75] Inventor: Masayuki Mizuno, Tokyo, Japan

[73] Assignee: NEC Corporation, Tokyo, Japan

[21] Appl. No.: 711,111

[22] Filed: Sep. 9, 1996

[51] Int. Cl.⁶ .................................................. H03K 17/16
[52] U.S. Cl. ...................... 326/81; 326/33; 326/34; 326/68
[58] Field of Search ...................... 326/21, 33, 34, 326/68, 80–81, 83, 86

[56] References Cited

U.S. PATENT DOCUMENTS

| | | | |
|---|---|---|---|
| 4,656,373 | 4/1987 | Plus | 326/81 |
| 4,825,106 | 4/1989 | Tipon et al. | 326/34 X |
| 5,151,619 | 9/1992 | Austin et al. | 326/86 |
| 5,204,557 | 4/1993 | Nguyen | 326/17 X |
| 5,362,999 | 11/1994 | Chiang | 326/83 X |
| 5,406,140 | 4/1995 | Wert et al. | 326/68 |
| 5,416,368 | 5/1995 | Sugibayashi | 326/68 |
| 5,418,474 | 5/1995 | Davis et al. | 326/81 X |
| 5,451,889 | 9/1995 | Heim et al. | 326/81 |
| 5,635,861 | 6/1997 | Chan et al. | 326/86 X |

*Primary Examiner*—David R. Hudspeth
*Attorney, Agent, or Firm*—Sughrue, Mion, Zinn, Macpeak & Seas, PLLC

[57] ABSTRACT

A level converting circuit includes a first power supply line of a high potential, a second power supply line of a low potential, a third power supply line of a potential lower than that of the first power supply line by some degree, and a first internal power supply line. The level converting circuit also includes an inverter circuit configured to output an output potential equal to that of the second power supply line when an input signal is equal to a potential of the third power supply line, and another output potential equal to that of the first power supply line when the input signal is equal to a potential of the second power supply line. Furthermore, the level converting circuit includes a switch circuit for supplying to the first internal power supply line the potential of the third power supply line when the input signal is equal to a potential of the third power supply line, and the potential of the first power supply line when the input signal is equal to the potential of the second power supply line.

11 Claims, 4 Drawing Sheets

HIGH SPEED SIGNAL LEVEL CONVERTING CIRCUIT HAVING A REDUCED CONSUMED ELECTRIC POWER

BACKGROUND OF THE INVENTION

1. Field of the Invention

The present invention relates to a signal level converting circuit implemented in a semiconductor device, and more specifically a high speed signal level converting circuit having a reduced consumed electric power.

2. Description of Related Art

Referring to FIG. 1, there is shown in a circuit diagram of a conventional level converting circuit. The shown conventional level converting circuit includes a first power supply line 101 of a high potential, a second power supply line 102 of a low potential, and a third power supply line 103 of a potential lower than that of the first power supply line 101 by some degree. Between the first power supply line 101 and the second power supply line 102, there are series-connected a pair of cross-connected pMOS transistors P11 and P12 and a pair of nMOS transistors N11 and N12 connected to a drain of the pMOS transistors. In addition, between the third power supply line 103 and the second power supply line 102, an inverter circuit composed of a pMOS transistor P13 and an nMOS transistor N13 is connected. An input signal line 105 is connected to in common to a gate of the transistors P13 and N13, and also connected to a gate of the nMOS transistor N12. Common-connected drains of the pMOS transistor P13 and an nMOS transistor N13 (namely, an output of the inverter) is connected to a gate of the nMOS transistor N11. An output signal line 106 is connected to common-connected drains of the pMOS transistor P12 and an nMOS transistor N12.

With the above mentioned arrangement, when a potential level of the input signal line 105 is the same as that of the second power supply line 102, namely, at a low level, a potential level of the gate of the nMOS transistor N11 becomes the same as that of the third power supply line 103, and a potential level of the gate of the nMOS transistor N12 becomes the same as that of the second power supply line 102. Accordingly, the nMOS transistor N11 is turned on, and the nMOS transistor N12 is turned off, so that a potential level of the drain of the pMOS transistor P11 becomes equal to that of the second power supply line 102. Therefore, the pMOS transistor P12 is turned on, so that a potential level of the drain of the pMOS transistor P12 becomes equal to that of the first power supply line 101. Namely, when the potential level of the input signal line 105 is the same as that of the second power supply line 102, the potential of the output signal line 106 becomes the same as that of the first power supply line 101, namely, at a high level.

On the other hand, when the potential level of the input signal line 105 is the same as that of the third power supply line 103, namely, at a high level, the potential level of the gate of the nMOS transistor N11 becomes the same as that of the second power supply line 102, and the potential level of the gate of the nMOS transistor N12 becomes the same as that of the third power supply line 103. Accordingly, the nMOS transistor N12 is turned on, and the nMOS transistor N11 is turned off, so that the potential level of the drain of the pMOS transistor P12 becomes equal to that of the second power supply line 102. Therefore, the pMOS transistor P11 is turned on, so that a potential level of the drain of the pMOS transistor P11 becomes equal to that of the first power supply line 101. Namely, when the potential level of the input signal line 105 is the same as that of the third power supply line 103, the potential of the output signal line 106 becomes the same as that of the second power supply line 102, namely, at a low level.

In the conventional level converting circuit as mentioned above, after an input signal applied to the input signal line 105 changes from the potential level of the second power supply line 102 to the potential level of the third power supply line 103, the potential of the output signal line 106 changes from the potential level of the first power supply line 101 to the potential level of the second power supply line 102. At this time, the nMOS transistor N12 is immediately turned on, but the nMOS transistor N11 is turned off after a delay time of the inverter circuit composed of the pMOS transistor P13 and the nMOS transistor N13. On the other hand, after the input signal applied to the input signal line 105 changes from the potential level of the third power supply line 103 to the potential level of the second power supply line 102, the potential of the output signal line 106 changes from the potential level of the second power supply line 102 to the potential level of the first power supply line 101. At this time, the nMOS transistor N12 is also immediately turned off, but the nMOS transistor N11 is turned on after the delay time of the inverter circuit composed of the pMOS transistor P13 and the nMOS transistor N13.

When the nMOS transistor N12 is on and the nMOS transistor N11 is off, the drain of the pMOS transistor P11 and the gate of the pMOS transistor P12 are at the potential level of the first power supply line 101, and the gate of the pMOS transistor P11 and the drain of the pMOS transistor P12 are at the potential level of the second power supply line 102. On the other hand, when the nMOS transistor N12 is off and the nMOS transistor N11 is on, the drain of the pMOS transistor P11 and the gate of the pMOS transistor P12 are at the potential level of the second power supply line 102, and the gate of the pMOS transistor P11 and the drain of the pMOS transistor P12 are at the potential level of the first power supply line 101.

Since the pMOS transistors P11 and P12 are cross-connected to each other in such a manner that the drain of one transistor is connected to the gate of the other transistor, a feedback loop is constituted. Therefore, a time from the moment that the drain of the pMOS transistor P11 and the gate of the pMOS transistor P12 have become the potential level of the first power supply line 101 to the moment that the gate of the pMOS transistor P11 and the drain of the pMOS transistor P12 have actually changed to the potential level of the second power supply line 102, and also another time from the moment that the drain of the pMOS transistor P11 and the gate of the pMOS transistor P12 have become the potential level of the second power supply line 102 to the moment that the gate of the pMOS transistor P11 and the drain of the pMOS transistor P12 have actually changed to the potential level of the first power supply line 101, become long.

Therefore, the above mention conventional level converting circuit has a disadvantage that a time from the transition of the potential of the input signal line 105 to the transition of the potential of the output signal line 106 is long.

Furthermore, the lower the potential of the third power supply line 103 is than that of the first power supply line 101, it is necessary to make an on-current of the nMOS transistor N11 and N12 much larger than an on-current of the pMOS transistor P11 and P12, with the result that a driving current supplied from the output signal line 106 is decreased. In other words, when the nMOS transistor N11 or N12 is turned on, the driving current flows through the pMOS transistor P11 or P12 to the power supply, so that a current driving the output signal line 106 is correspondingly decreased.

In addition, the potential changing time of the output signal line 106 is different dependently upon the direction of the transition of the potential of the input signal line 105. Therefore, even if a signal having a duty ratio of 50% is applied to the input signal line 105, an output signal having a duty ratio of 50% cannot be obtained from the output signal line 106.

SUMMARY OF THE INVENTION

Accordingly, it is an object of the present invention to provide a signal level converting circuit which has overcome the above mentioned defect of the conventional one.

Another object of the present invention is to provide a high speed signal level converting circuit having a reduced consumed electric power.

The above and other objects of the present invention are achieved in accordance with the present invention by a signal level converting circuit comprising a first power supply line of a high potential, a second power supply line of a low potential, a third power supply line of a potential lower than that of the first power supply line, a first internal power supply line, an inverter circuit configured to output an output potential equal to that of the second power supply line when an input signal is equal to a potential of the third power supply line, and another output potential equal to that of the first power supply line when the input signal is equal to a potential of the second power supply line, and a first switch circuit for supplying the potential of the third power supply line to the first internal power supply line when the input signal is equal to a potential of the third power supply line, and the potential of the first power supply line to the first internal power supply line when the input signal is equal to the potential of the second power supply line.

With the above mentioned arrangement, a high speed signal level conversion can be realized by utilizing the nature that a delay time between the input and the output of the inverter circuit (having no feedback path) is very short. In addition, the transistor constituting the inverter circuit can be turned completely off, by selectively bringing the internal power supply line to the potential of the first power supply line or the potential of the third power supply line. Therefore, a through-current is made zero, with the result that the consumed electric power can be reduced.

According to another aspect of the present invention, there is provided a signal level converting circuit comprising a first power supply line of a high potential, a second power supply line of a low potential, a fourth power supply line of a potential higher than that of the second power supply line, a second internal power supply line, an inverter circuit configured to output an output potential equal to that of the second power supply line when an input signal is equal to a potential of the first power supply line, and another output potential equal to that of the first power supply line when the input signal is equal to a potential of the fourth power supply line, and a switch circuit for supplying the potential of the fourth power supply line to the second internal power supply line when the input signal is equal to a potential of the fourth power supply line, and the potential of the second power supply line to the second internal power supply line when the input signal is equal to the potential of the first power supply line.

Similarly, a high speed signal level conversion can be realized by utilizing the nature that a delay time between the input and the output of the inverter circuit (having no feedback path) is very short. In addition, the transistor constituting the inverter circuit can be turned completely off, by selectively bringing the second internal power supply line to the potential of the second power supply line or the potential of the fourth power supply line. Therefore, the through-current is made zero, with the result that the consumed electric power can be reduced.

The above and other objects, features and advantages of the present invention will be apparent from the following description of preferred embodiments of the invention with reference to the accompanying drawings.

DESCRIPTION OF THE PREFERRED EMBODIMENTS

Figure 1:
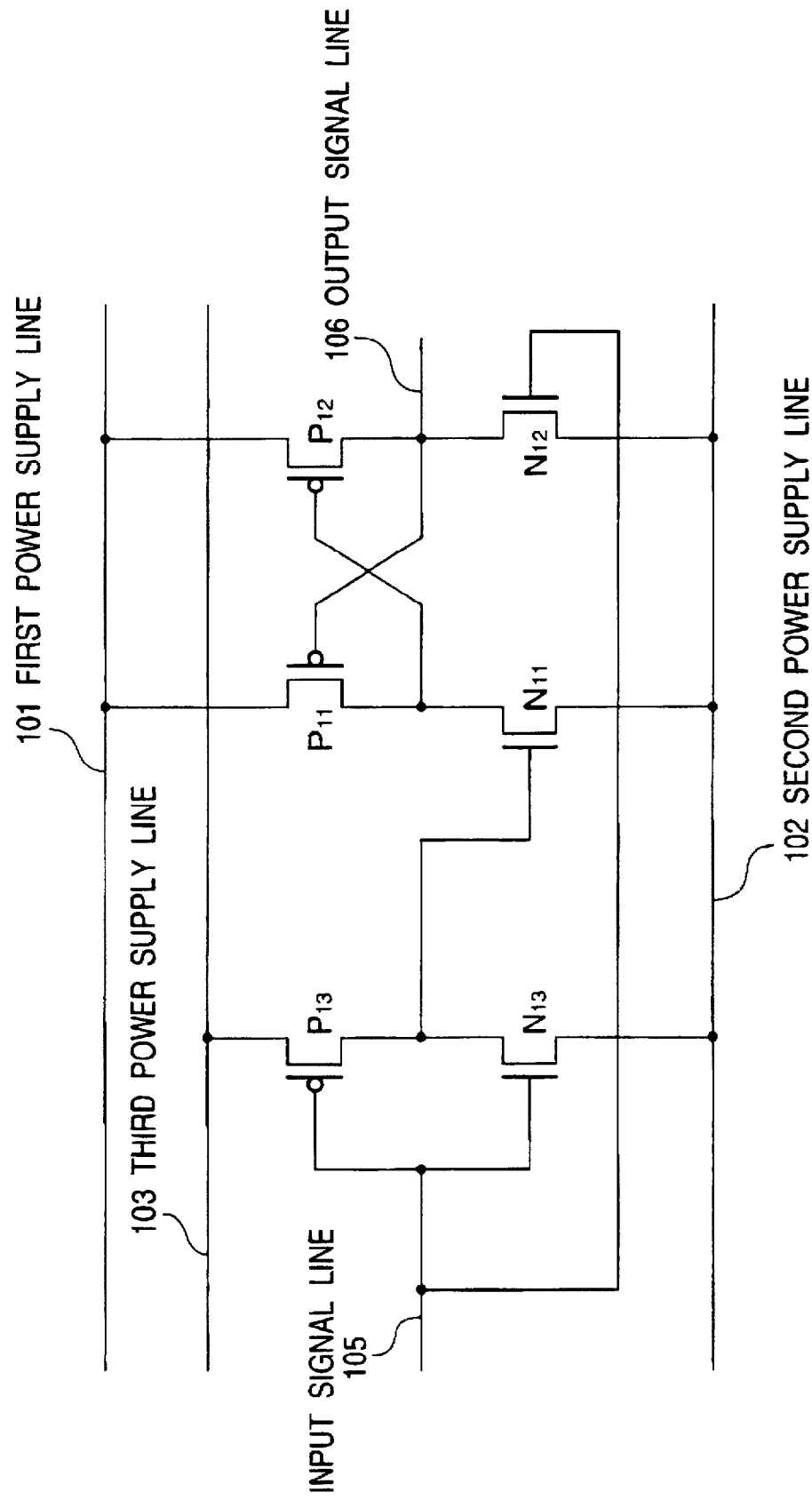
FIG. 1 is a circuit diagram of a conventional signal level converting circuit.
Figure 2:
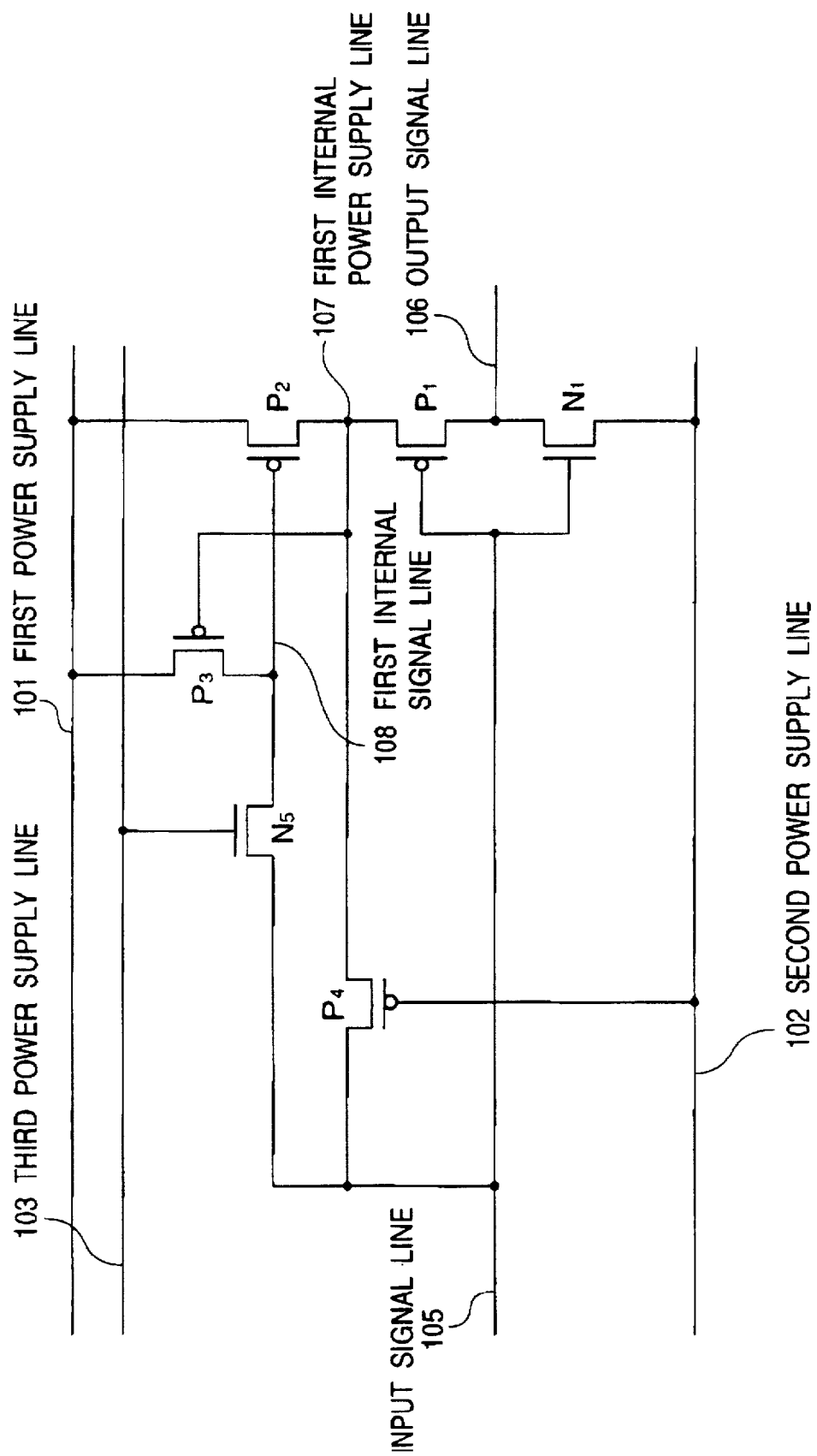
FIG. 2 is a circuit diagram of a first embodiment of the signal level converting circuit in accordance with the present invention.

Referring to FIG. 2, there is shown a circuit diagram of a first embodiment of the signal level converting circuit in accordance with the present invention.

The shown first embodiment of the signal level converting circuit is of a signal inverting type, and includes a first power supply line 101 of a high potential, a second power supply line 102 of a low potential, a third power supply line 103 of a potential lower than that of the first power supply line 101 by some degree, and a first internal power supply line 107. The first embodiment also includes an input signal line 105, an output signal line 106, and an inverter circuit configured to output an output potential equal to that of the second power supply line 102 when an input signal applied to the input signal line 105 is equal to a potential of the third power supply line 103, and another output potential equal to that of the first power supply line 101 when the input signal applied to the input signal line 105 is equal to a potential of the second power supply line 102. Furthermore, the first embodiment includes a first switch circuit for supplying to the first internal power supply line 107 the potential of the third power supply line 103 when the input signal applied to the input signal line 105 is equal to a potential of the third power supply line 103, and the potential of the first power supply line 101 when the input signal is equal to the potential of the second power supply line 102.

More specifically, the inverter circuit includes a first pMOS transistor P1 and a first nMOS transistor N1 having a drain common-connected to the output signal line 106 and a gate common-connected to the input signal line 105. A source of the first nMOS transistor N1 is connected to the second power supply line 102, and a source of the first pMOS transistor P1 is connected to the first internal power supply line 107.

The switch circuit includes a second pMOS transistor P2 having a source connected to the first power supply line 101, a drain connected to the first internal power supply line 107 and a gate connected to a first internal signal line 108, a third pMOS transistor P3 having a source connected to the first power supply line 101, a drain connected to the first internal signal line 108, and a gate connected to the first internal power supply line 107, a fifth nMOS transistor N5 having a source connected to the first internal signal line 108, a drain connected to the input signal line 105 and a gate connected to the third power supply line 103, and a fourth pMOS transistor P4 having a source connected to the input signal line 105, a drain connected to the first internal power supply line 108, and a gate connected to the second power supply line 102.

With the above mentioned arrangement, when the input signal line 105 is at a high level, namely, at the potential of the third power supply line 103 lower than that of the first power supply line 101, since the first nMOS transistor N1 is on and the first pMOS transistor P1 is off in the inverter circuit composed of the nMOS transistor N1 and the pMOS transistor P1, a signal of a low level, namely, of the potential of the second power supply line 102, is outputted to the output signal line 106.

At this time, furthermore, since the input signal line 105 is at the high level, the fourth pMOS transistor P4 is on, and the fifth nMOS transistor N5 is off, so that the potential of the first internal power supply line 107 becomes equal to the potential of the third power supply line 103, which is the potential of the input signal line 105. Accordingly, the third pMOS transistor P3 is turned on and the second pMOS transistor N2 is rendered completely off. Thus, no through-current flows from the first power supply line 101 to the second power supply line 102, with the result that a low electric power consumption can be realized.

On the other hand, when the input signal line 105 is at a low level, since the fourth pMOS transistor P4 becomes off, the fifth nMOS transistor N5 becomes on, the second pMOS transistor P2 becomes on and the third pMOS transistor P3 becomes off, so that the potential of the first internal power supply line 107 becomes equal to the potential of the first power supply line 101. In addition, in the inverter circuit composed of the nMOS transistor N1 and the pMOS transistor P1, since the nMOS transistor N1 is off and the pMOS transistor P1 is on, a signal of a high level, namely, of the potential of the first power supply line 101, is outputted to the output signal line 106. At this time, furthermore, since the first nMOS transistor N1 is off, no through-current flows from the first power supply line 101 to the second power supply line 102, with the result that a low electric power consumption can be realized.

Furthermore, when the input signal line 105 is brought from the high level to the low level, or alternatively, from the low level to the high level, since there is not a signal feedback as in the conventional level converting circuit, the output signal line 106 immediately changes by action of the first pMOS transistor P1 and the first nMOS transistor N1, with the result that a high speed signal level conversion can be realized.

As seen from the above, the first embodiment realizes the high speed signal level conversion by utilizing the nature that a substitution time between an input and an output of a CMOS inverter constituted of a pMOS transistor P1 and an nMOS transistor N1 (and having no feedback path) is very short. Furthermore, one of the transistors constituting the inverter circuit might be not put in a complete off condition because the potential of the third power supply line 103 lower than that of the first power supply line 101 is used. However, the transistor can be turned completely off by selectively putting the potential of the first internal power supply line 107 to either the potential of the first power supply line or the potential of the third power supply line, with the result that the though-current is made zero, so as to reduce the consumed electric power.

Figure 3:
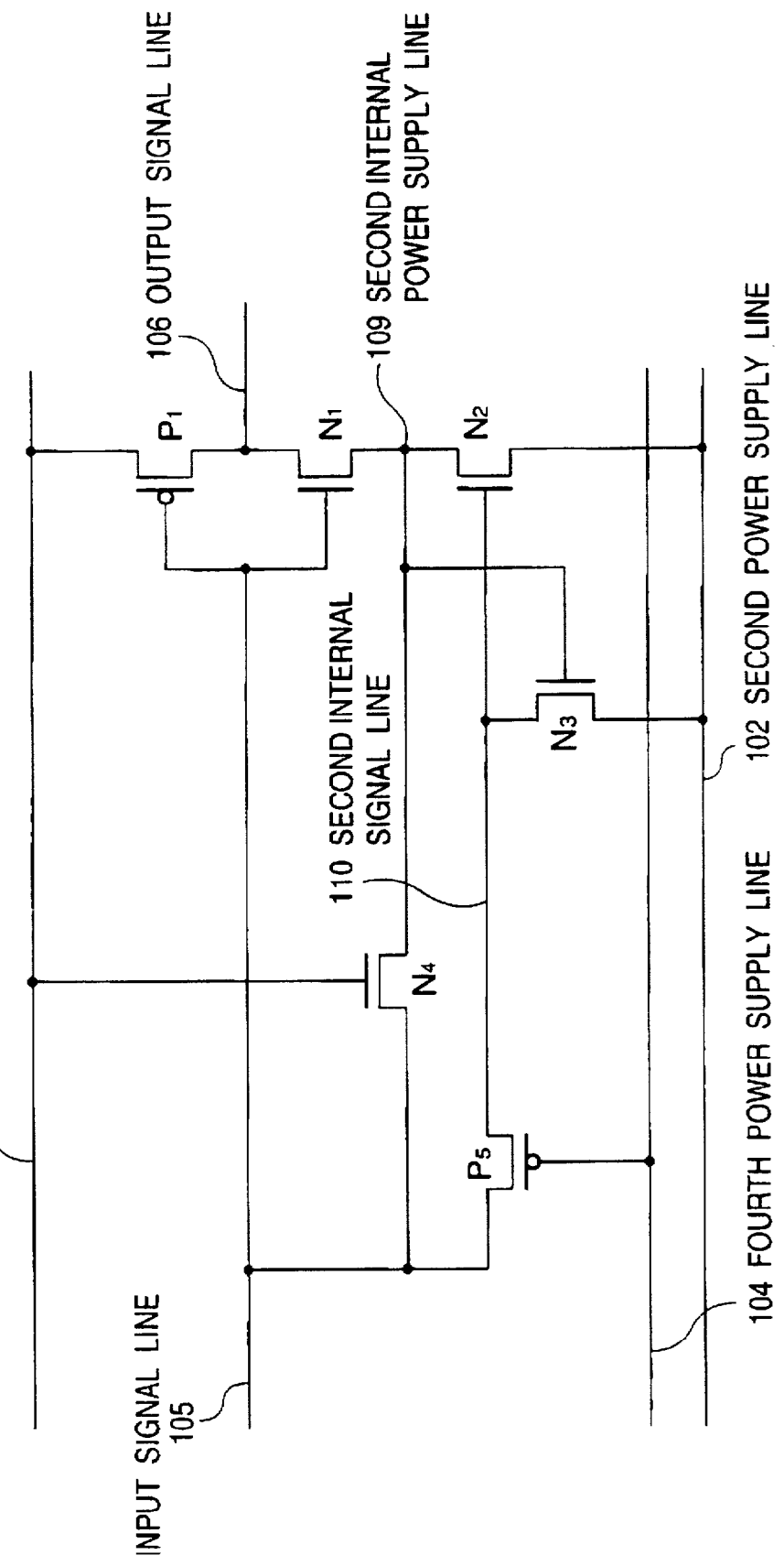
FIG. 3 is a circuit diagram of a second embodiment of the signal level converting circuit in accordance with the present invention.

Referring to FIG. 3, there is shown a circuit diagram of a second embodiment of the signal level converting circuit in accordance with the present invention.

The shown second embodiment of the level converting circuit is also of the signal inverting type, and includes a first power supply line 101 of a high potential, a second power supply line 102 of a low potential, a fourth power supply line 104 of a potential higher than that of the second power supply line 102 by some degree, and a second internal power supply line 109. The second embodiment also includes an input signal line 105, an output signal line 106, and an inverter circuit configured to output an output potential equal to that of the second power supply line 102 when an input signal applied to the input signal line 105 is equal to a potential of the first power supply line 101, and another output potential equal to that of the first power supply line 101 when the input signal applied to the input signal line 105 is equal to a potential of the fourth power supply line 104. Furthermore, the second embodiment includes a second switch circuit for supplying the potential of the fourth power supply line 104 to the second internal power supply line 109 when the input signal applied is equal to a potential of the fourth power supply line 104, and the potential of the second power supply line 102 to the second internal power supply line 109 when the input signal is equal to the potential of the first power supply line 101.

More specifically, the inverter circuit is of the same construction as that of the inverter circuit in the first embodiment. But, the source of the first nMOS transistor N1 is connected to the second internal power supply line 109, and a source of the first pMOS transistor P1 is connected to the first power supply line 101.

The switch circuit includes a second nMOS transistor N2 having a source connected to the second power supply line 102, a drain connected to the second internal power supply line 109 and a gate connected to a second internal signal line 110, a third nMOS transistor N3 having a source connected to the second power supply line 102, a drain connected to the second internal signal line 110, and a gate connected to the second internal power supply line 109, a fifth pMOS transistor P5 having a source connected to the input signal line 105, a drain connected to the second internal signal line 110 and a gate connected to the fourth power supply line 104, and a fourth nMOS transistor N4 having a source connected to the second internal power supply line 109, a drain connected to the input signal line 105, and a gate connected to the first power supply line 101.

With the above mentioned arrangement, when the input signal line 105 is at a high level, namely, at a potential of the first power supply line 101, since the first pMOS transistor P1 is off and the first nMOS transistor N1 is on in the inverter circuit composed of the nMOS transistor N1 and the pMOS transistor P1. At this time, since the input signal line 105 is at the high level, the fourth nMOS transistor N4 is turned off and the fifth pMOS transistor P5 is turned on, and therefore, the second nMOS transistor N2 is turned on and the third nMOS transistor N3 is turned off, so that the potential of the second internal power supply line 109 becomes equal to the potential of the second power supply line 102. Therefore, a signal of a low level, namely, of the potential of the second power supply line 102, is outputted to the output signal line 106. On the other hand, since the first pMOS transistor P1 is rendered completely off, no through-current flows from the first power supply line 101 to the second power supply line 102, with the result that a low electric power consumption can be realized.

When the input signal line 105 is at a low level, namely at the potential of the fourth power supply line 104 higher than the potential of the second power supply line 102, since the first pMOS transistor P1 becomes on and the first nMOS transistor N1 becomes off, so that a signal of a high level, namely at the potential of the first power supply line 101 is outputted to the output signal line 106. At this time, the fourth nMOS transistor N4 becomes on, and the fifth pMOS transistor P5 becomes off, so that the potential of the second internal power supply line 109 becomes equal to the potential of the fourth power supply line 104, which is at the level of the input signal line 105. At this time, furthermore, the second nMOS transistor N2 is turned off and the third nMOS transistor N3 is turned on. Furthermore, the first nMOS transistor N1 is rendered completely off. Therefore, no through-current flows from the first power supply line 101 to the second power supply line 102, with the result that a low electric power consumption can be realized.

Furthermore, when the input signal line 105 is brought from the high level to the low level, or alternatively, from the low level to the high level, since there is not a signal feedback as in the conventional level converting circuit, the output signal line 106 immediately changes by action of the first pMOS transistor P1 and the first nMOS transistor N1, with the result that a high speed signal level conversion can be realized.

As seen from the above, the second embodiment similarly realizes the high speed signal level conversion by utilizing the nature that a substitution time between an input and an output of a CMOS inverter constituted of a pMOS transistor P1 and an nMOS transistor N1 (and having no feedback path) is very short. Furthermore, since one of the transistors constituting the inverter circuit might be not put in a complete off condition because the potential of the fourth power supply line 104 higher than that of the second power supply line 102 is used. However, the transistor can be turned completely off by selectively putting the potential of the second internal power supply line 109 to either the potential of the second power supply line or the potential of the fourth power supply line, with the result that the though-current is made zero, so as to reduce the consumed electric power.

Figure 4:
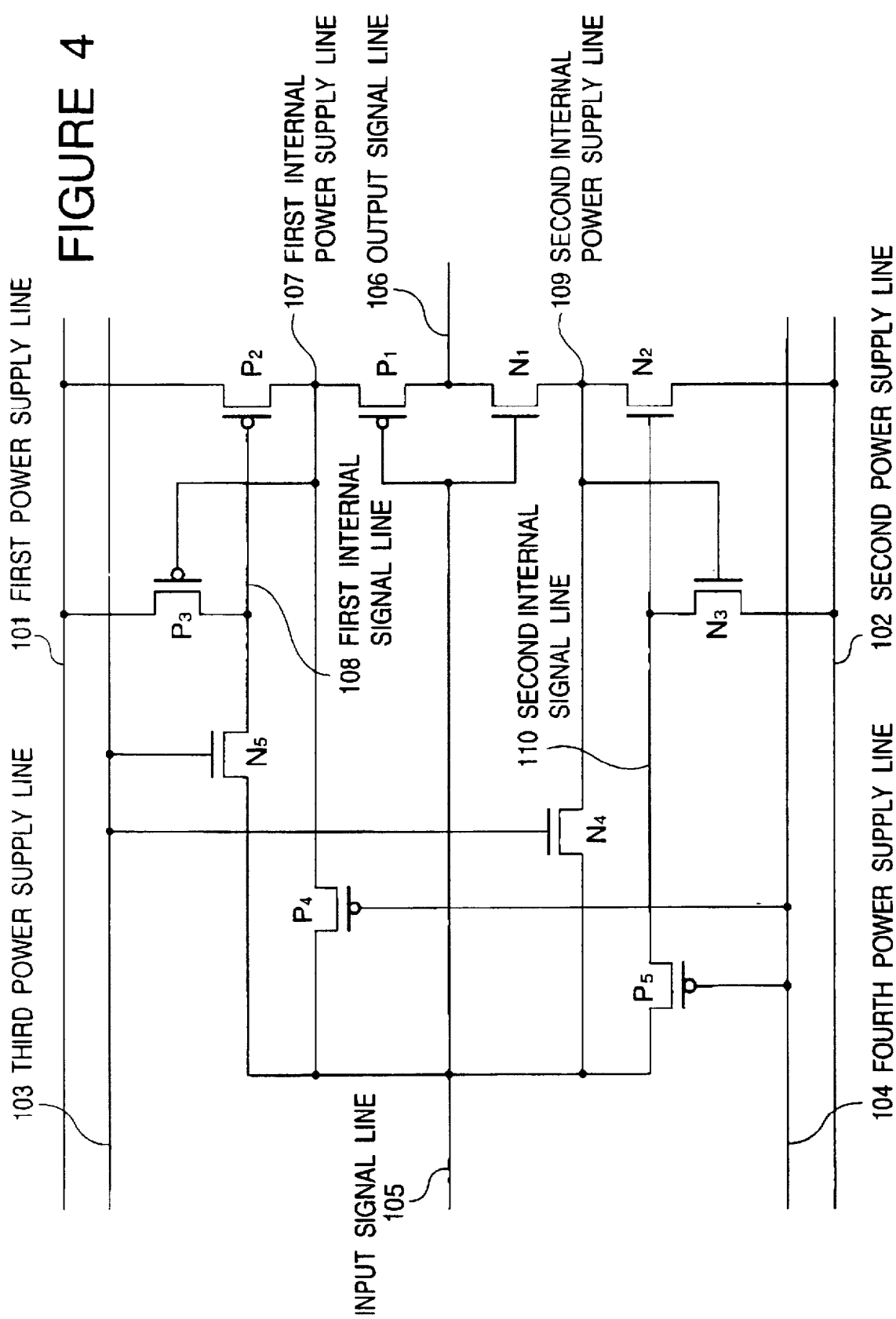
FIG. 4 is a circuit diagram of a third embodiment of the signal level converting circuit in accordance with the present invention.

Referring to FIG. 4, there is shown a circuit diagram of a third embodiment of the signal level converting circuit in accordance with the present invention. This third embodiment is a combination of the first and second embodiments shown in FIGS. 2 and 3, and therefore, in FIG. 4, elements similar to those shown in FIGS. 2 and 3 are given the same Reference Numerals and Signs.

The shown third embodiment includes a first power supply line 101 of a high potential, a second power supply line 102 of a low potential, a third power supply line 103 of a potential lower than that of the first power supply line 101 by some degree, a fourth power supply line 104 of a potential higher than that of the second power supply line 102 by some degree, an input signal line 105, an output signal line 106, and first and second internal power supply lines 107 and 109. The third embodiment also includes an inverter circuit configured to output an output potential equal to that of the second power supply line 102 when an input signal applied to the input signal line 105 is equal to a potential of the third power supply line 103, and another output potential equal to that of the first power supply line 101 when the input signal applied to the input signal line 105 is equal to a potential of the fourth power supply line 104.

Furthermore, the third embodiment includes a first switch circuit for supplying to the first internal power supply line 107 the potential of the third power supply line 103 when the input signal is equal to a potential of the third power supply line 103, and the potential of the first power supply line 101 when the input signal is equal to the potential of the fourth power supply line 104, and a second switch circuit for supplying to the second internal power supply line 109 the potential of the fourth power supply line 104 when the input signal is equal to a potential of the fourth power supply line 104, and the potential of the second power supply line 102 when the input signal is equal to the potential of the third power supply line 103.

In the third embodiment, the inverter circuit is of the same construction as that of the inverter circuit in the first and second embodiments. But, the source of the first pMOS transistor P1 is connected to the first internal power supply line 107, and the source of the first nMOS transistor N1 is connected to the second internal power supply line 109. The first switch circuit is the same as that of the first embodiment, and the second switch circuit is the same as that of the second embodiment. Therefore, further explanation of the construction will be omitted.

With the above mentioned arrangement, when the input signal line 105 is at a high level, namely, at a potential of the third power supply line 103 lower than a potential of the first power supply line 101, the inverter circuit outputs to the output signal line 106, a signal of a low level, namely, of the potential of the second power supply line 102. At this time, the fifth nMOS transistor N5 and the fourth nMOS transistor N4 are turned off, and the fourth pMOS transistor P4 and the fifth pMOS transistor P5 are turned on, so that the potential of the first internal power supply line 107 becomes equal to the potential of the third power supply line 103, and the potential of the second internal power supply line 109 becomes equal to the potential of the second power supply line 102. In addition, since the first nMOS transistor N1 is on, the potential of the second power supply line 102 is supplied to the output signal line 106. On the other hand, since the first pMOS transistor P1 is rendered completely off, no through-current flows from the first power supply line 101 to the second power supply line 102, with the result that a low electric power consumption can be realized.

On the other hand, when the input signal line 105 is at a low level, namely, at a potential of the fourth power supply line 104 higher than a potential of the second power supply line 102, the inverter circuit outputs to the output signal line 106, a signal of a high level, namely, of the potential of the first power supply line 101. At this time, the fifth nMOS transistor N5 and the fourth NMOS transistor N4 are turned on, and the fourth pMOS transistor P4 and the fifth pMOS transistor P5 are turned off, so that the potential of the first internal power supply line 107 becomes equal to the potential of the first power supply line 101, and the potential of the second internal power supply line 109 becomes equal to the potential of the fourth power supply line 104. In addition, since the first nMOS transistor N1 is rendered completely off, no through-current flows from the first power supply line 101 to the second power supply line 102, with the result that a low electric power consumption can be realized.

When the input signal line 105 is brought from the high level to the low level, or alternatively, from the low level to the high level, since there is not a signal feedback as in the conventional level converting circuit, the output signal line 106 immediately changes by action of the first pMOS transistor P1 and the first nMOS transistor N1, with the result that a high speed signal level conversion can be realized.

Furthermore, similarly to the first and second embodiments, the third embodiment realizes the high speed signal level conversion by utilizing the nature that a substitution time between an input and an output of a CMOS inverter constituted of a pMOS transistor P1 and an nMOS transistor N1 is very short. Furthermore, either of the transistors constituting the inverter circuit might be not put in a complete off condition because the potential of the third power supply line 103 lower than that of the first power supply line 101 and the potential of the fourth power supply line 104 higher than that of the second power supply line 102 are used. However, the transistor can be turned completely off by selectively putting the potential of the first and second internal power supply lines 107 and 109 to the potential of the third and fourth power supply lines, with the result that the though-current is made zero, so as to reduce the consumed electric power.

As seen from the above, the level converting circuit in accordance with the present invention carries out the signal level conversion fundamentally by using an inverter circuit having no feedback path, and therefore, can realize a high speed signal level conversion since a delay time between the input and the output of the inverter circuit having no feedback path is very short. In addition, the level converting circuit in accordance with the present invention internally includes the first and/or internal power supply line which is controlled to be selectively brought to the potential of the third or fourth power supply line in response to the potential of the input signal. With this construction, the transistor constituting the inverter circuit can be turned completely off, so that the through-current is made zero, with the result that the consumed electric power can be reduced.

Therefore, if a signal having a duty ratio of 50% is applied to the input signal line, an output signal having a duty ratio of 50% can be obtained from the output signal line.

The invention has thus been shown and described with reference to the specific embodiments. However, it should be noted that the present invention is in no way limited to the details of the illustrated structures but changes and modifications may be made within the scope of the appended claims.

I claim:

1. A signal level converting circuit comprising a first power supply line of a high potential, a second power supply line of a low potential, a third power supply line of a potential lower than that of said first power supply line, a first internal power supply line, an inverter circuit configured to output an output potential equal to that of said second power supply line when an input signal is equal to a potential of said third power supply line, and another output potential equal to that of said first power supply line when said input signal is equal to a potential of said second power supply line, and a first switch circuit for supplying the potential of said third power supply line to said first internal power supply line when said input signal is equal to a potential of said third power supply line, and the potential of said first power supply line to said first internal power supply line when said input signal is equal to the potential of said second power supply line.

2. A signal level converting circuit claimed in claim 1 wherein said inverter includes a first pMOS transistor and a first nMOS transistor having a drain common-connected to an output signal line, and a gate common-connected to an input signal line.

3. A signal level converting circuit claimed in claim 2 wherein said first switch circuit includes a second pMOS transistor having a source connected to said first power supply line, a drain connected to said first internal power supply line and a gate connected to a first internal signal line, a third pMOS transistor having a source connected to said first power supply line, a drain connected to said first internal signal line, and a gate connected to said first internal power supply line, a fourth pMOS transistor having a source connected to said input signal line, a drain connected to said first internal power supply line, and a gate connected to said second power supply line, and a fifth nMOS transistor having a source connected to said first internal signal line, a drain connected to an input signal line, and a gate connected to said third power supply line.

4. A signal level converting circuit comprising a first power supply line of a high potential, a second power supply line of a low potential, a fourth power supply line of a potential higher than that of said second power supply line, a second internal power supply line, an inverter circuit configured to output an output potential equal to that of said second power supply line when an input signal is equal to a potential of said first power supply line, and another output potential equal to that of said first power supply line when said input signal is equal to a potential of said fourth power supply line, and a switch circuit for supplying the potential of said fourth power supply line to said second internal power supply line when said input signal is equal to a potential of said fourth power supply line, and the potential of said second power supply line to said second internal power supply line when said input signal is equal to the potential of said first power supply line.

5. A signal level converting circuit claimed in claim 4 wherein said inverter includes a first pMOS transistor and a first nMOS transistor having a drain common-connected to an output signal line, and a gate common-connected to an input signal line.

6. A signal level converting circuit claimed in claim 5 wherein said second switch circuit includes a second nMOS transistor having a source connected to said second power supply line, a drain connected to said second internal power supply line and a gate connected to a second internal signal line, a third nMOS transistor having a source connected to said second power supply line, a drain connected to said second internal signal line, and a gate connected to said second internal power supply line, a fourth nMOS transistor having a source connected to said second internal power supply line, a drain connected to said input signal line, and a gate connected to said first power supply line, and a fifth pMOS transistor having a source connected to said input signal line, a drain connected to said second internal signal line and a gate connected to said fourth power supply line.

7. A signal level converting circuit comprising a first power supply line of a high potential, a second power supply line of a low potential, a third power supply line of a potential lower than that of said first power supply line, a first internal power supply line, a second internal power supply line, an inverter circuit configured to output an output potential equal to that of said second power supply line when an input signal is equal to a potential of said third power supply line, and another output potential equal to that of said first power supply line when said input signal is equal to a potential of said fourth power supply line, and a first switch circuit for supplying to said first internal power supply line the potential of said third power supply line when said input signal is equal to a potential of said third power supply line, and the potential of said first power supply line when said input signal is equal to the potential of said fourth power supply line, and a second switch circuit for supplying to said second internal power supply line the potential of said fourth power supply line when said input signal is equal to a potential of said fourth power supply line, and the potential of said second power supply line when said input signal is equal to the potential of said third power supply line.

8. A signal level converting circuit claimed in claim 7 wherein said inverter includes a first pMOS transistor and a first nMOS transistor having a drain common-connected to an output signal line, and a gate common-connected to an input signal line.

9. A signal level converting circuit claimed in claim 8 wherein said first switch circuit includes a second pMOS transistor having a source connected to said first power supply line, a drain connected to said first internal power supply line and a gate connected to a first internal signal line, a third pMOS transistor having a source connected to said first power supply line, a drain connected to said first internal signal line, and a gate connected to said first internal power supply line, a fourth pMOS transistor having a source connected to said input signal line, a drain connected to said first internal power supply line, and a gate connected to said second power supply line, and a fifth nMOS transistor having a source connected to said first internal signal line, a drain connected to an input signal line, and a gate connected to said third power supply line.

10. A signal level converting circuit claimed in claim 8 wherein said second switch circuit includes a second nMOS transistor having a source connected to said second power supply line, a drain connected to said second internal power supply line and a gate connected to a second internal signal line, a third nMOS transistor having a source connected to said second power supply line, a drain connected to said second internal signal line, and a gate connected to said second internal power supply line, a fourth nMOS transistor having a source connected to said second internal power supply line, a drain connected to said input signal line, and a gate connected to said first power supply line, and a fifth pMOS transistor having a source connected to said input signal line, a drain connected to said second internal signal line and a gate connected to said fourth power supply line.

11. A signal level converting circuit claimed in claim 8 wherein said first switch circuit includes a second pMOS transistor having a source connected to said first power supply line, a drain connected to said first internal power supply line and a gate connected to a first internal signal line, a third pMOS transistor having a source connected to said first power supply line, a drain connected to said first internal signal line, and a gate connected to said first internal power supply line, a fourth pMOS transistor having a source connected to said input signal line, a drain connected to said first internal power supply line, and a gate connected to said second power supply line, and a fifth nMOS transistor having a source connected to said first internal signal line, a drain connected to an input signal line, and a gate connected to said third power supply line, and wherein said second switch circuit includes a second nMOS transistor having a source connected to said second power supply line, a drain connected to said second internal power supply line and a gate connected to a second internal signal line, a third nMOS transistor having a source connected to said second power supply line, a drain connected to said second internal signal line, and a gate connected to said second internal power supply line, a fourth nMOS transistor having a source connected to said second internal power supply line, a drain connected to said input signal line, and a gate connected to said first power supply line, and a fifth pMOS transistor having a source connected to said input signal line, a drain connected to said second internal signal line and a gate connected to said fourth power supply line.

\* \* \* \* \*

UNITED STATES PATENT AND TRADEMARK OFFICE
CERTIFICATE OF CORRECTION

PATENT NO. : 5,789,942
DATED      : August 4, 1998
INVENTOR(S) : Masayuki Mizuno It is certified that error appears in the above-identified patent and that said Letters Patent is hereby corrected as shown below:

Title page, item [30] Foreign Application Priority Data --
Sept. 7, 1995  [JP] Japan    7-255547--.

Signed and Sealed this

Twenty-sixth Day of December, 2000

Attest:

Q. TODD DICKINSON

*Attesting Officer*        *Director of Patents and Trademarks*